US012588477B2

(12) United States Patent
Zhao et al.

(10) Patent No.: US 12,588,477 B2
(45) Date of Patent: Mar. 24, 2026

(54) METHOD OF ETCHING A SEMICONDUCTOR DEVICE BY ETCHING INITIAL MASK STRUCTURES AT A REGION HAVING AN EXTENSION DIRECTION DIFFERENT FROM THE EXTENSION DIRECTION OF THE INITIAL MASK STRUCTURES

(71) Applicants: Semiconductor Manufacturing International (Shanghai) Corporation, Shanghai (CN); Semiconductor Manufacturing International (Beijing) Corporation, Beijing (CN)

(72) Inventors: Zhenyang Zhao, Shanghai (CN); Shiliang Ji, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 714 days.

(21) Appl. No.: 17/454,674

(22) Filed: Nov. 12, 2021

(65) Prior Publication Data

US 2022/0148880 A1 May 12, 2022

(30) Foreign Application Priority Data

Nov. 12, 2020 (CN) ......................... 202011263278.X

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0338; H01L 21/0332; H01L 21/0335; H01L 21/0337; H01L 21/0334; H01L 21/3081; H01L 21/3083
See application file for complete search history.

(56) References Cited

U.S. PATENT DOCUMENTS 7,598,174 B1 * 10/2009 Zhuang .................. H10B 10/12
                                                    438/689
9,685,440 B1 * 6/2017 Cheng .................. H10D 86/011
(Continued)

*Primary Examiner* — William B Partridge
*Assistant Examiner* — Linda J. Fleck
(74) *Attorney, Agent, or Firm* — Anova Law Group, PLLC

(57) ABSTRACT

A semiconductor structure and a method for fabricating the semiconductor structure are provided in the present disclosure. The method includes providing a substrate, wherein the substrate includes a plurality of first regions to-be-etched extending along a first direction; a first region to-be-etched includes a central region and an edge region adjacent to each of two sides of the central region; and a material layer to-be-etched is on the substrate; forming a plurality of discrete initial mask structures on the material layer to-be-etched; etching initial mask structures at the edge region till a surface of the material layer to-be-etched is exposed to form a plurality of mask structures; using the plurality of mask structures as a mask, etching the material layer to-be-etched to form a plurality of discrete layers to-be-etched; and removing layers to-be-etched at the central region till a surface of the substrate is exposed.

14 Claims, 7 Drawing Sheets

(56)  References Cited

U.S. PATENT DOCUMENTS

| | | | | |
|---|---|---|---|---|
| 9,793,174 | B1 * | 10/2017 | Huang | H10D 30/024 |
| 10,304,744 | B1 * | 5/2019 | Joseph | H01L 21/0228 |
| 10,361,129 | B1 * | 7/2019 | Sieg | H01L 21/823487 |
| 2007/0155104 | A1 * | 7/2007 | Marchant | H10D 30/668 |
| | | | | 257/E29.136 |
| 2009/0009235 | A1 * | 1/2009 | Yamamoto | G11C 8/08 |
| | | | | 327/512 |
| 2009/0081595 | A1 * | 3/2009 | Hatakeyama | H01L 21/0273 |
| | | | | 430/323 |
| 2015/0017804 | A1 * | 1/2015 | Ryou | H01L 21/31144 |
| | | | | 438/671 |
| 2015/0145042 | A1 * | 5/2015 | Bu | H01L 27/1203 |
| | | | | 438/197 |
| 2016/0013103 | A1 * | 1/2016 | Huang | H01L 21/76877 |
| | | | | 438/666 |
| 2016/0093502 | A1 * | 3/2016 | Cheng | H01L 21/3086 |
| | | | | 257/623 |
| 2016/0329248 | A1 * | 11/2016 | Liou | H10D 30/62 |
| 2018/0090491 | A1 * | 3/2018 | Huang | H01L 27/0886 |
| 2018/0114699 | A1 * | 4/2018 | Mohanty | H01L 21/3088 |
| 2018/0166321 | A1 * | 6/2018 | Sun | H01L 21/768 |
| 2019/0067446 | A1 * | 2/2019 | Ching | H10D 84/0193 |
| 2019/0148520 | A1 * | 5/2019 | Chang | H01L 21/3086 |
| | | | | 257/192 |
| 2021/0005456 | A1 * | 1/2021 | Sung | H01L 21/0337 |
| 2021/0090889 | A1 * | 3/2021 | Cheng | H01L 21/0337 |
| 2021/0098305 | A1 * | 4/2021 | Yang | H10D 84/0128 |
| 2021/0217614 | A1 * | 7/2021 | Lutker-Lee | H01L 21/0337 |
| 2022/0013366 | A1 * | 1/2022 | Cheng | H01L 29/7827 |
| 2023/0047263 | A1 * | 2/2023 | Verdy | H10B 63/24 |
| 2023/0238245 | A1 * | 7/2023 | Su | H01L 29/66227 |
| | | | | 257/401 |
| 2024/0274694 | A1 * | 8/2024 | Chiang | H10D 84/038 |

* cited by examiner

METHOD OF ETCHING A SEMICONDUCTOR DEVICE BY ETCHING INITIAL MASK STRUCTURES AT A REGION HAVING AN EXTENSION DIRECTION DIFFERENT FROM THE EXTENSION DIRECTION OF THE INITIAL MASK STRUCTURES

CROSS-REFERENCE TO RELATED APPLICATION

This application claims the priority of Chinese Patent Application No. 202011263278.X, filed on Nov. 12, 2020, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

With the rapid development of integrated circuit manufacturing technology, the sizes of semiconductor devices in integrated circuits are continuously reduced, such that the operation speed of entire integrated circuits is effectively improved. However, when the device sizes are further reduced, it may challenge the existing process correspondingly.

In semiconductor device manufacturing, the photolithography process is usually used to transfer the pattern on a mask to a substrate. The photolithography process includes providing the substrate; forming a photoresist on the substrate; exposing and developing the photoresist to form a patterned photoresist, such that the pattern on the mask is transferred to the photoresist; etching the substrate using the patterned photoresist as a mask, such that the pattern on the photoresist is transferred to the substrate; and removing the photoresist.

However, the existing method may have poor quality in implementing pattern transfer.

SUMMARY

One aspect of the present disclosure provides a method for fabricating a semiconductor structure. The method includes providing a substrate, wherein the substrate includes a plurality of first regions to-be-etched extending along a first direction; a first region to-be-etched includes a central region and an edge region adjacent to each of two sides of the central region; the central region and the edge region are arranged along a second direction; and a material layer to-be-etched is on the substrate; forming a plurality of discrete initial mask structures on the material layer to-be-etched, wherein the plurality of discrete initial mask structures extends along the second direction and is arranged along the first direction; etching initial mask structures at the edge region till a surface of the material layer to-be-etched is exposed to form a plurality of mask structures; using the plurality of mask structures as a mask, etching the material layer to-be-etched to form a plurality of discrete layers to-be-etched, wherein the plurality of discrete layers to-be-etched extends along the second direction; and removing layers to-be-etched at the central region till a surface of the substrate is exposed.

Optionally, the substrate further includes a plurality of second regions to-be-etched extending along the second direction; and the layers to-be-etched at the central region and layers to-be-etched at the plurality of second regions to-be-etched are removed simultaneously.

Optionally, for etching the initial mask structures at the edge region, a first opening is formed in the plurality of mask structures, and the first opening passes through the plurality of mask structures along the first direction; using the plurality of mask structures as the mask, the material layer to-be-etched is etched to form a second opening in the plurality of layers to-be-etched; and the second opening passes through the plurality of layers to-be-etched along the first direction.

Optionally, for removing the layers to-be-etched at the central region, a third opening is formed in the plurality of layers to-be-etched; and the third opening passes through the plurality of layers to-be-etched along the first direction.

Optionally, along the second direction, the third opening and the second opening are connected with each other.

Optionally, along the second direction, the second opening has a first size; the third opening has a second size; and the first size is less than the second size.

Optionally, the first size ranges from about 50 nanometers to about 110 nanometers.

Optionally, the plurality of initial mask structures is formed by forming a mask structure material film on the surface of the material layer to-be-etched, forming a plurality of mask layers on a surface of the mask structure material film, and using the plurality of mask layers as a mask, etching the mask structure material film till the material layer to-be-etched is exposed to form the plurality of initial mask structures.

Optionally, the mask structure material film includes a first mask material film on the surface of the material layer to-be-etched, a second mask material film on a surface of the first mask material film, and a third mask material film on a surface of the second mask material film.

Optionally, the first mask material film is made of a material including silicon oxide, silicon nitride, silicon carbon nitride, silicon boron nitride, silicon nitrogen carbon oxide, silicon nitrogen oxide, or a combination thereof; the second mask material film is made of a material including silicon oxide, silicon nitride, silicon carbon nitride, silicon boron nitride, silicon nitrogen carbon oxide, silicon nitrogen oxide, or a combination thereof; and the third mask material film is made of a material including silicon oxide, silicon nitride, silicon carbon nitride, silicon boron nitride, silicon nitrogen carbon oxide, silicon nitrogen oxide, or a combination thereof.

Optionally, the plurality of mask layers is formed by a self-aligned multiple patterning process.

Optionally, a material of the plurality of mask layers is different from a material of the mask structure material film; and the plurality of mask layers is made of the material including silicon oxide, silicon nitride, silicon carbon nitride, silicon boron nitride, silicon nitrogen carbon oxide, silicon nitrogen oxide, or a combination thereof.

Optionally, etching the initial mask structures at the edge region includes forming a first sacrificial layer, covering a surface of the initial mask structures, on the substrate; forming a first patterned layer on a surface of the first sacrificial layer, wherein the first patterned layer has a first dividing groove exposing a surface of the first sacrificial layer at the edge region; using the first patterned layer as a mask, etching the initial mask structures and the first sacrificial layer till the surface of the material layer to-be-etched is exposed, and forming the plurality of mask structures and the first opening in the plurality of mask structures; and after the plurality of mask structures is formed, removing the first patterned layer and the first sacrificial layer.

Optionally, removing the layers to-be-etched at the central region includes forming a second sacrificial layer, covering the layers to-be-etched, on the substrate; forming a second patterned layer on a surface of the second sacrificial layer, wherein the second patterned layer has a second dividing groove and a third dividing groove, the second dividing groove exposes a surface of the second sacrificial layer at the central region, and the third dividing groove exposes a surface of the second sacrificial layer at a second region to-be-etched; using the second patterned layer as a mask, etching the second sacrificial layer and the layers to-be-etched till the surface of the substrate is exposed; removing the layers to-be-etched at the central region, and forming the third opening in the layers to-be-etched; and after the second sacrificial layer and the layer to-be-etched are etched, removing the second patterned layer and the second sacrificial layer.

Optionally, the material layer to-be-etched is made of a material including silicon, germanium, silicon germanium, or any combination thereof.

Another aspect of the present disclosure provides a semiconductor structure. The structure includes a substrate; a plurality of mask structures, wherein a first opening is formed in the plurality of mask structures; and a plurality of layers to-be-etched, wherein a second opening and a third opening are formed in the plurality of layers to-be-etched.

Optionally, along a second direction, the third opening and the second opening are connected with each other.

Optionally, along a second direction, the second opening has a first size; the third opening has a second size; and the first size is less than the second size.

Optionally, the first size ranges from about 50 nanometers to about 110 nanometers.

Compared with the existing technology, the technical solutions provided by the present disclosure may achieve at least the following beneficial effects.

In the method for fabricating the semiconductor structure provided by the technical solutions of the present disclosure, the initial mask structures at the edge region may be etched; and the extension direction of the edge region may be different from the extension direction of the initial mask structures, such that the distances between adjacent mask structures formed may remain unchanged along the first direction. Furthermore, the mask structures may be used as the mask in the subsequent process to etch the material layer to-be-etched, which may be beneficial for reducing the loading effect and improving the stability of the pattern transfer, such that the size uniformity of the plurality of formed layers to-be-etched may be desirable.

Furthermore, the position and size of the second opening may be determined by the position and size of the first opening in the mask structures. The second opening in the layers to-be-etched may be formed through etching the material layer to-be-etched, using the mask structures as the mask, to form the layers to-be-etched and the second opening located in the layers to-be-etched; and the second opening may pass through the layers to-be-etched along the first direction. Therefore, it may avoid that the layers to-be-etched are etched after forming the plurality of discrete layers to-be-etched, such that the dividing structure may be formed in the layers to-be-etched along the first direction, the stress damage caused by the layers to-be-etched may be reduced, and the occurrence of lattice mismatch may be reduced, thereby being beneficial for improving the performance of the formed semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference may be made in detail to exemplary embodiments of the disclosure, which are illustrated in the accompanying drawings. Wherever possible, same reference numbers may be used throughout the accompanying drawings to refer to same or like parts.

It should be noted that the "surface" and "upper" in the present disclosure are used to describe the relative positional relationship in space and are not limited to whether there is a direct contact.

A semiconductor structure and a method for fabricating the semiconductor structure are provided in the present disclosure. The method includes providing a substrate, wherein the substrate includes a plurality of first regions to-be-etched extending along a first direction; a first region to-be-etched includes a central region and an edge region adjacent to each of two sides of the central region; and a material layer to-be-etched is on the substrate; forming a plurality of discrete initial mask structures on the material layer to-be-etched; etching initial mask structures at the edge region till a surface of the material layer to-be-etched is exposed to form a plurality of mask structures; using the plurality of mask structures as a mask, etching the material layer to-be-etched to form a plurality of discrete layers to-be-etched; and removing layers to-be-etched at the central region till a surface of the substrate is exposed.

The reasons for the poor performance of the existing semiconductor structure are first explained in detail with reference to the accompanying drawings. FIGS. 1-5 illustrate structural schematics corresponding to certain stages of a method for forming an exemplary semiconductor structure in the existing technology.

Figure 1:
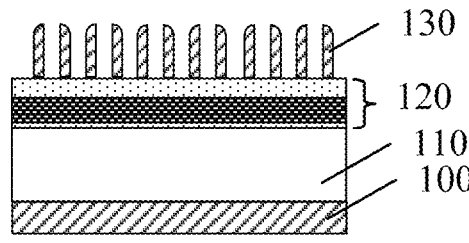
FIGS. 1-5 illustrate structural schematics corresponding to certain stages of a method for forming an exemplary semiconductor structure in the existing technology.
Figure 2:
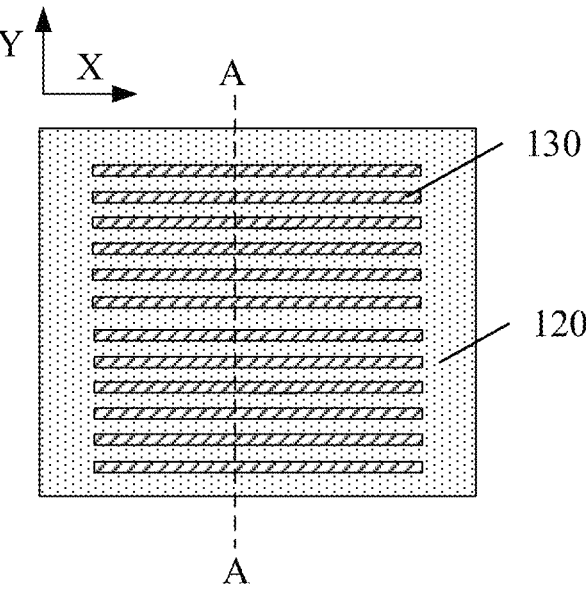

Referring to FIGS. 1-2, FIG. 2 illustrates a top view of FIG. 1, and FIG. 1 illustrates a cross-sectional view along a tangent direction AA in FIG. 2. A substrate 100 may be provided, and a material layer to-be-etched 110 may be on the substrate 100.

Still referring to FIGS. 1-2, a mask structure material film 120 may be formed on the surface of the material layer to-be-etched 110, and a plurality of discrete mask layers 130 may be formed on the surface of the mask structure material film 120. The mask layers 130 may extend along the second direction X, and the plurality of the mask layers 130 may be arranged along the first direction Y.

Figure 3:
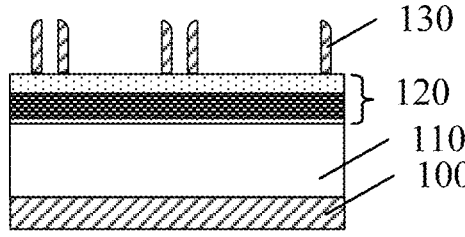

Referring to FIG. 3, the view directions of FIG. 3 and FIG. 1 are same. The first etching process may be used to remove different numbers of mask layers 130 along the second direction X.

Figure 4:
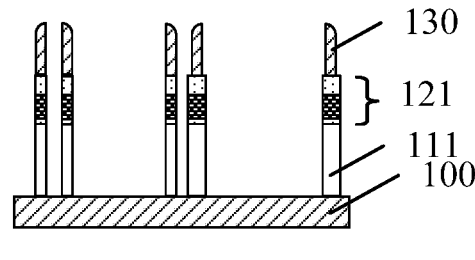

Referring to FIG. 4, the view directions of FIG. 4 and FIG. 3 are same. After the first etching process, using the remaining mask layers 130 as a mask, the mask structure material film 120 and the material layer to-be-etched 110 may be etched to form a plurality of discrete layers to-be-etched 111 and mask structures 121 respectively located on the surface of the layers to-be-etched 111.

Figure 5:
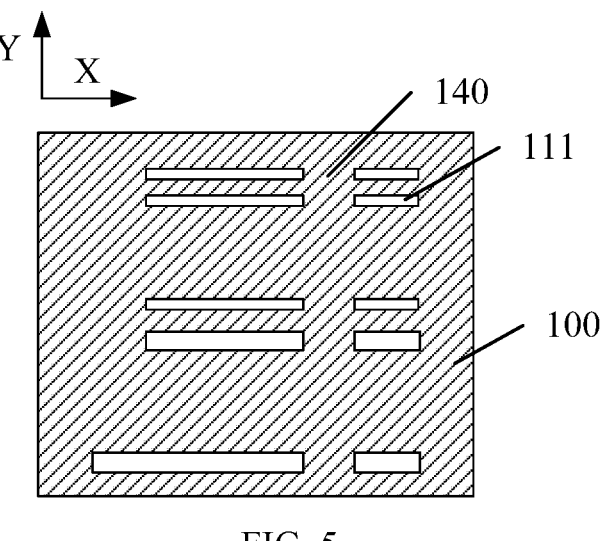

Referring to FIG. 5, the view directions of FIG. 5 and FIG. 2 are same, and the mask structures and the mask layers are omitted in FIG. 5. Using the second etching process, a part of the layers to-be-etched 111 may be etched along the first direction Y, and an opening 140 may be formed in the layers to-be-etched 111. In addition, the opening 140 may pass through the layers to-be-etched 111 along the first direction Y.

In the above-mentioned method, through the first etching process, a part of the mask layers 130 may be removed along the second direction X; using the remaining mask layers 130 as the mask, the material layer to-be-etched 110 may be etched to form discrete layers to-be-etched 111; and partial patterning process may be completed for the layers to-be-etched of the target pattern to be formed finally. Then, the second etching process may be used to etch a part of the layers to-be-etched 111 along the first direction Y to form the opening 140 in the layers to-be-etched 111, and finally the layers to-be-etched of the target pattern may be formed.

However, in the process of removing the part of the mask layers 130 in the first etching process, the quantity of mask layers 130 removed may be different, which may result in that the spacings between the remaining adjacent mask layers 130 along the first direction Y may be inconsistent. Since the spacings between the remaining mask layers 130 are inconsistent, the pattern of the mask layer 130 may be transferred to the material layer to-be-etched 110. That is, in the process of etching the material layer to-be-etched 110 using the remaining mask layers 130 as the mask, loading effect may easily occur in the etching process. As a result, the stability of pattern transfer may be poor, and the widths of the formed layers to-be-etched 111 may be inconsistent.

In order to solve above-mentioned technical problems, various embodiments of the present disclosure provide a method for forming a semiconductor structure, including etching initial mask structures at the edge region till the surface of the material layer to-be-etched is exposed to form a plurality of mask structures; using the mask structures as a mask to etch the material layer to-be-etched to form a plurality of discrete layers to-be-etched, where the layers to-be-etched may extend along the second direction; and removing the layers to-be-etched at the central region till the surface of the substrate is exposed. Since the distance between adjacent mask structures formed remains unchanged along the first direction, loading effect may be easily reduced during the process of etching the material layer to-be-etched using the mask structures as the mask, which may improve the stability of the pattern transfer and make the size uniformity of formed layers to-be-etched desirable.

In order to clearly illustrate the above-mentioned objectives, features, and advantages of the present disclosure, various embodiments of the present disclosure are described in detail with reference to the accompanying drawings hereinafter.

FIGS. 6-19 and 20A-20B illustrate structural schematics corresponding to certain stages of a method for forming an exemplary semiconductor structure according to various disclosed embodiments of the present disclosure.

Figure 6:
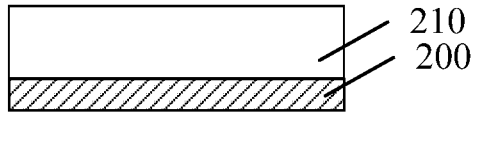
FIGS. 6-19 and 20A-20B illustrate structural schematics corresponding to certain stages of a method for forming an exemplary semiconductor structure according to various disclosed embodiments of the present disclosure.
Figure 7:
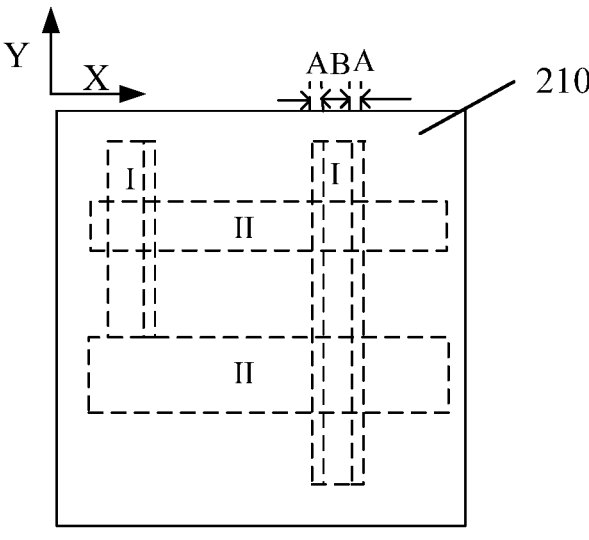

Referring to FIGS. 6-7, FIG. 7 illustrates a top view of FIG. 6, and a substrate 200 may be provided. The substrate 200 may include a plurality of first regions to-be-etched I extending along the first direction Y; the first region to-be-etched I may include a central region B and an edge region A adjacent to each of two sides of the central region B; the central region B and the edge region A may be arranged along the second direction X; and a material layer to-be-etched 210 may be on the substrate 200.

The material layer to-be-etched 210 may be made of a material including silicon, germanium, silicon germanium, and/or any other suitable material(s). In one embodiment, the material layer to-be-etched 210 may be made of silicon.

In one embodiment, the material of the substrate 200 may be made of silicon.

In other embodiments, the material of the substrate may be made of a material including silicon carbide, silicon germanium, a multi-element semiconductor material including group III-V elements, silicon-on-insulator (SOI), germanium-on-insulator (GOI), and/or any other suitable material(s). The multi-element semiconductor material including group III-V elements may contain InP, GaAs, GaP, InAs, InSb, InGaAs, InGaAsP, and/or any other suitable material(s).

In one embodiment, the substrate 200 may further include a plurality of second regions to-be-etched II; and the second regions to-be-etched II may extend along the second direction X.

Next, a plurality of discrete initial mask structures may be formed on the material layer to-be-etched 210. The initial mask structures may extend along the second direction X, and the plurality of initial mask structures may be arranged along the first direction Y. The process of forming the initial mask structures may refer to FIGS. 8-11.

Figure 8:
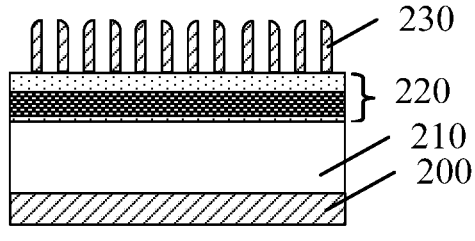
Figure 9:
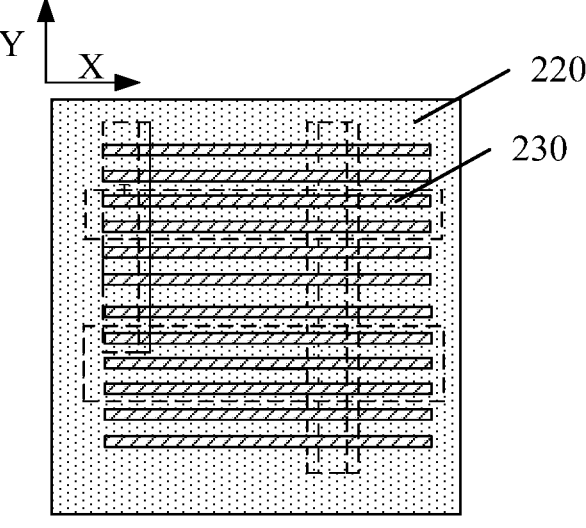

Referring to FIGS. 8-9, the view directions of FIG. 8 and FIG. 6 may be same; the view directions of FIG. 9 and FIG. 7 may be same; a mask structure material film 220 may be formed on the surface of the material layer to-be-etched 210; and a plurality of discrete mask layers 230 may be formed on the surface of the mask structure material film 220.

The mask structure material film 220 may provide a material layer for subsequent formation of the initial mask structures.

The mask structure material film 220 may include the first mask material film (not labeled in FIGS. 8-9) on the surface of the material layer to-be-etched 210; the second mask material film (not labeled in FIGS. 8-9) on the surface of the first mask material film; and the third mask material film (not labeled in FIGS. 8-9) on the surface of the second mask material film.

The first mask material film may protect the surface of the material layer to-be-etched 210, thereby reducing the influence of the subsequent process on the material layer to-be-etched 210; the second mask material film may be used as a stop layer for the subsequent etching process; and the third mask material film may be used to protect the surface of the second mask material film.

The first mask material film may be made of a material including silicon oxide, silicon nitride, silicon carbon nitride, silicon boron nitride, silicon nitrogen carbon oxide, silicon nitrogen oxide, or a combination thereof. The second mask material film may be made of a material including silicon oxide, silicon nitride, silicon carbon nitride, silicon boron nitride, silicon nitrogen carbon oxide, silicon nitrogen oxide, or a combination thereof. The third mask material film may be made of a material including silicon oxide, silicon nitride, silicon carbon nitride, silicon boron nitride, silicon nitrogen carbon oxide, silicon nitrogen oxide, or a combination thereof.

In one embodiment, the material of the first mask material film may be silicon oxide, the material of the second mask material film may be silicon nitride, and the material of the third mask material film may be silicon oxide.

The material of the mask layer 230 and the material of the mask structure material film 220 may be different from each other.

The mask layer 230 may be made of a material including silicon oxide, silicon nitride, silicon carbon nitride, silicon boron nitride, silicon nitrogen carbon oxide, silicon nitrogen oxide, or a combination thereof. In one embodiment, the mask layer 230 may be made of silicon nitride.

The mask layers 230 may be formed by a self-aligned multiple patterning process. In one embodiment, a plurality of discrete mask layers 230 may be formed by the self-aligned double patterning process. The widths of the mask layers 230 formed by the self-aligned double patterning process may be relatively small, which may satisfy higher integration requirements for integrated circuits.

Figure 10:
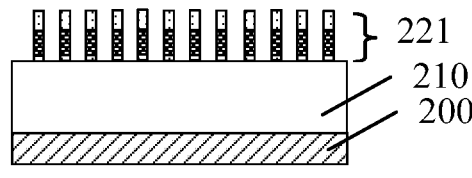
Figure 11:
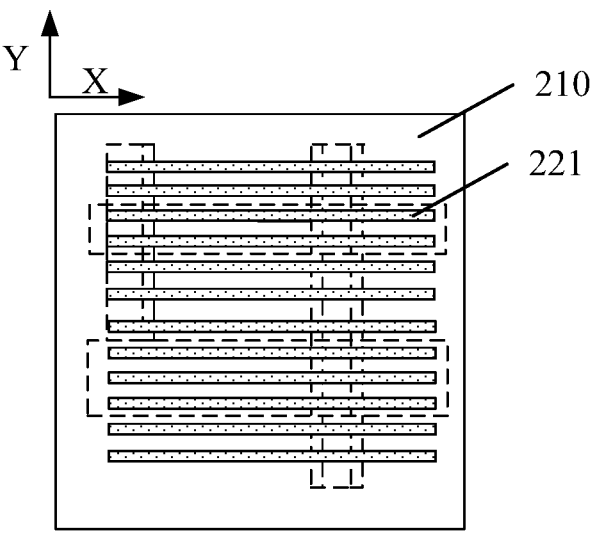

Referring to FIGS. 10-11, using the mask layers 230 as a mask, the mask structure material film 220 may be etched till the material layer to-be-etched 210 is exposed to form initial mask structures 221.

The initial mask structures 221 may be subsequently etched to form mask structures.

The mask structure material film 220 may be etched by a dry etching process, a wet etching process, or a combination thereof.

In one embodiment, the mask structure material film 220 may be etched by a dry etching process. The sidewalls of the initial mask structures 221 formed by the dry etching process may have desirable morphology, which may be beneficial for improving the accuracy of the subsequent pattern transfer process of etching the material layer to-be-etched 210 using the initial mask structures 221 as the mask.

In one embodiment, after the initial mask structures 221 are formed, the mask layers 230 may be removed.

Since the distances between the plurality of mask layers 230 are relatively small, etching loading effect may not easily occur during the process of etching the mask structure material film 220 using the mask layers 230 as the mask. Therefore, the pattern of the mask layers 230 may be transferred to the mask structure material film 220 more stably.

Figure 12:
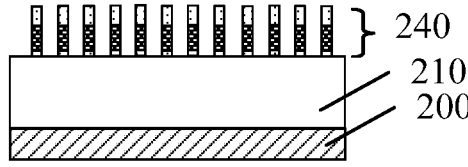
Figure 13:
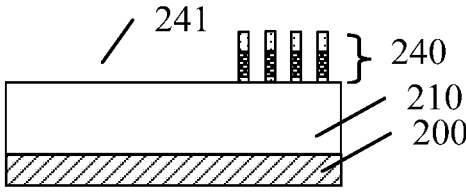
Figure 14:
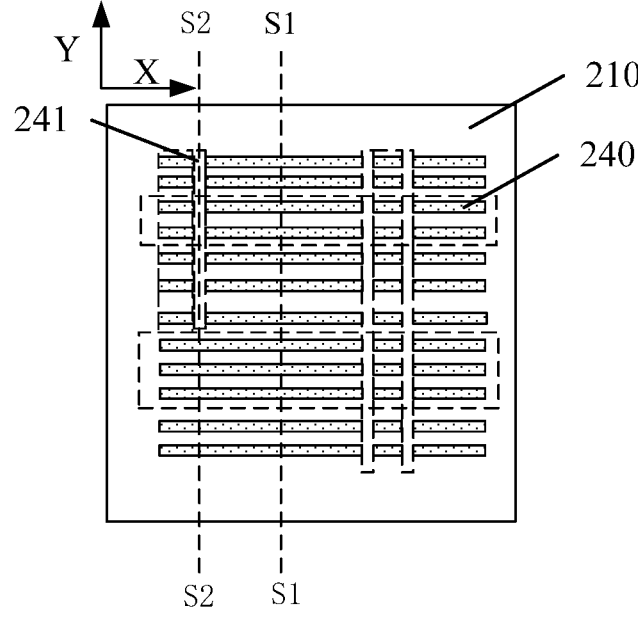

Referring to FIGS. 12-14, FIG. 12 illustrates a cross-sectional view along a tangent direction S1-S1 in FIG. 14, FIG. 13 illustrates a cross-sectional view along a tangent direction S2-S2 in FIG. 14, and FIG. 14 illustrates a top view of FIGS. 12-13. The initial mask structures 221 at the edge region A may be etched till the surface of the material layer to-be-etched 210 is exposed to form a plurality of mask structures 240.

The mask structures 240 may be used as a mask for subsequent etching of the material layer to-be-etched 210.

For example, for etching the initial mask structures 221 at the edge region A, the first opening 241 may be formed in the mask structures 240, and the first opening 241 may pass through the mask structures 240 along the first direction Y.

Etching the initial mask structures 221 at the edge region A may include forming the first sacrificial layer (not shown in FIGS. 12-14) covering the surface of the initial mask structures 221 on the substrate 200; forming the first patterned layer (not shown in FIGS. 12-14) on the surface of the first sacrificial layer, where the first patterned layer may have the first dividing groove (not shown in FIGS. 12-14) exposing the surface of the first sacrificial layer at the edge region; using the first patterned layer as a mask, etching the initial mask structures 221 and the first sacrificial layer till surface of the material layer to-be-etched 210 is exposed to form the mask structures 240 and the first opening 241 located in the mask structures 240; and after the mask structures 240 are formed, removing the first patterned layer and the first sacrificial layer.

The initial mask structures 221 at the edge region A may be etched; the extension direction of the edge region A may be different from the extension direction of the initial mask structures 221, and the edge region A may extend along the first direction Y. Therefore, the distances between adjacent mask structures 240 formed may remain unchanged along the first direction Y. Furthermore, the mask structures 240 may be used as the mask in the subsequent process to etch the material layer to-be-etched 210, which may be beneficial for reducing the loading effect and improving the stability of the pattern transfer, such that the size uniformity of the formed layers to-be-etched may be desirable.

Along the second direction X, the size of the first opening 241 may range from about 50 nanometers to about 110 nanometers.

Subsequently, using the mask structures 240 as the mask, the material layer to-be-etched 210 may be etched to form the layers to-be-etched and the second opening located in the layers to-be-etched. The size of the first opening 241 in the mask structures 240 is relatively small and the etching loading effect generated is relatively small. Therefore, along the extension direction of the layers to-be-etched, the size of the layer to-be-etched at the position adjacent to the second opening and the size of the layer to-be-etched at the position away from the second opening may have a desirable uniformity.

Figure 15:
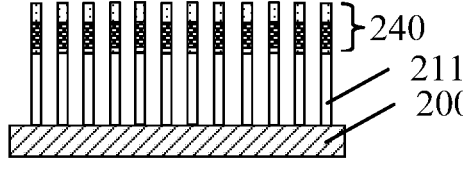
Figure 16:
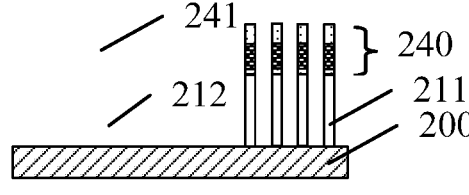
Figure 17:
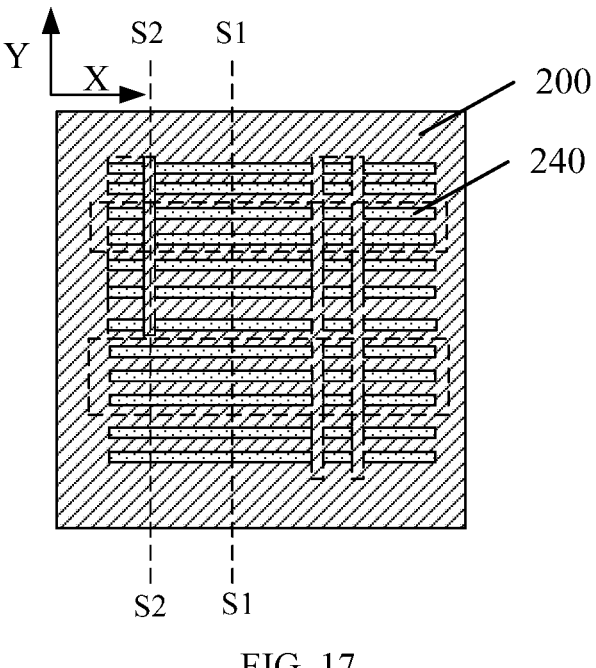

Referring to FIGS. 15-17, the view directions of FIGS. 15 and 12 are same, the view directions of FIGS. 16 and 13 are same, and the view directions of FIGS. 17 and 14 are same. Using the mask structures 240 as a mask, the material layer to-be-etched 210 may be etched to form a plurality of discrete layers to-be-etched 211; and the layers to-be-etched 211 may extend along the second direction X.

For example, the mask structures 240 may have the first opening 241, such that using the mask structures 241 as the mask, the material layer to-be-etched 210 may be etched to form the second opening 212 in the layers 211 to-be-etched. In addition, the second opening 212 may pass through the layers to-be-etched 211 along the first direction Y.

The position and size of the second opening 212 may correspond to the position and size of the first opening 241.

The position and size of the second opening 212 may be determined by the position and size of the first opening 241 in the mask structures 240. The second opening 212 in the layers to-be-etched 211 may be formed through etching the material layer to-be-etched 210, using the mask structures 240 as the mask, to form the layers to-be-etched 211 and the second opening 212 located in the layers to-be-etched 211; and the second opening 212 may pass through the layers to-be-etched 211 along the first direction Y. Therefore, it can avoid that the layers to-be-etched 211 are etched after forming the plurality of discrete layers to-be-etched 211, and a dividing structure may be formed in the layers to-be-etched 211 along the first direction Y, such that the stress damage caused by the layers to-be-etched 211 may be reduced, and the occurrence of lattice mismatch may be reduced, thereby being beneficial for improving the performance of the formed semiconductor structure.

Figure 18:
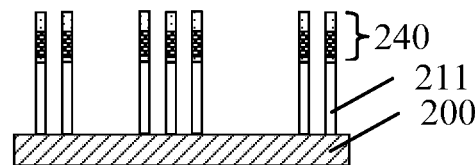
Figure 19:
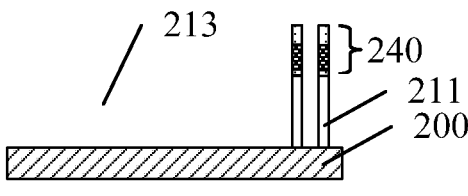
Figure 20A:
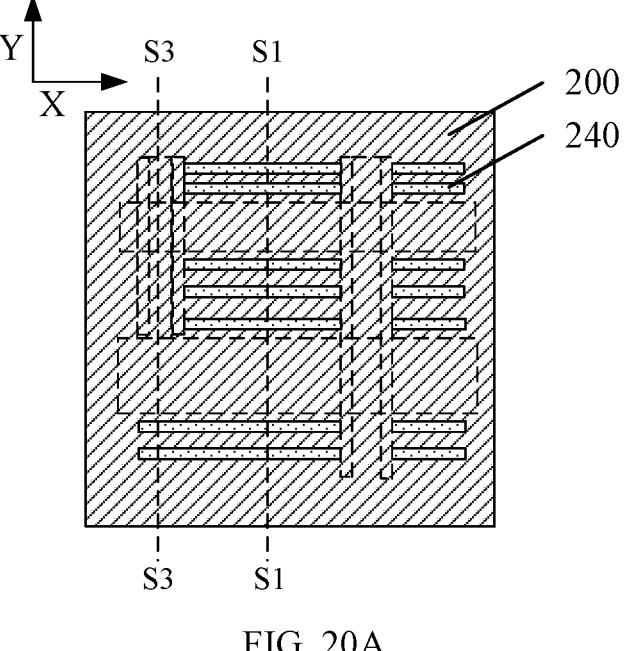
Figure 20B:
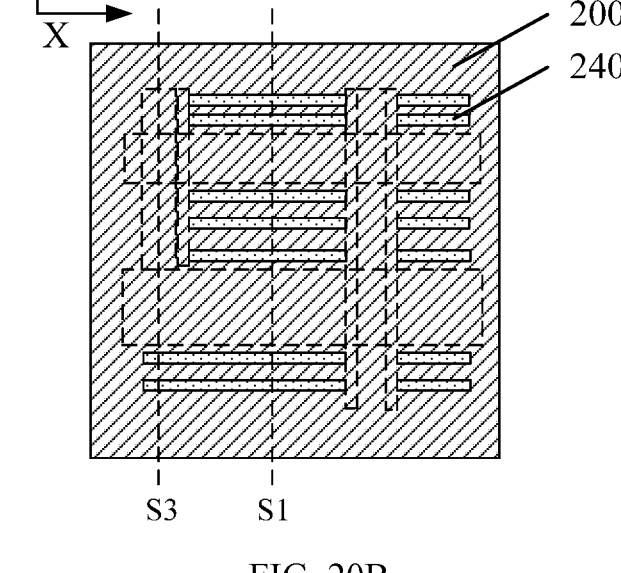

Referring to FIGS. 18-19 and 20A-20B, the view directions of FIG. 18 and FIG. 15 are same; FIG. 19 illustrates a cross-sectional view along a tangent direction S3-S3 in FIG. 20B; and the view directions of FIG. 20B and FIG. 17 are same. The layers to-be-etched 211 at the central region B may be removed till the surface of the substrate 200 is exposed.

In one embodiment, the layers to-be-etched 211 at the central region B and the layers to-be-etched 211 at the second region to-be-etched II may be removed simultaneously.

For example, for removing the layers to-be-etched 211 at the central region B, the third opening 213 may be formed in the layers to-be-etched 211; and the third opening 213 may pass through the layers to-be-etched 211 along the first direction Y.

Removing the layers to-be-etched 211 at the central region B may include forming the second sacrificial layer (not shown in FIGS. 18-19 and 20A-20B) covering the layers to-be-etched 211 on the substrate 200; forming the second patterned layer (not shown in FIGS. 18-19 and 20A-20B) on the surface of the second sacrificial layer, where the second patterned layer may have the second dividing groove (not shown in FIGS. 18-19 and 20A-20B) and the third dividing groove (not shown in FIGS. 18-19 and 20A-20B), the second dividing groove (not shown in FIGS. 18-19 and 20A-20B) may expose the surface of the second sacrificial layer at the central region B, and the third dividing groove may expose the surface of the second sacrificial layer at the second region to-be-etched II; using the second patterned layer as a mask, etching the second sacrificial layer and the layers to-be-etched 211 till the surface of the substrate 200 is exposed, removing the layers to-be-etched 211 at the central region B, and forming the third opening 213 in the layers to-be-etched 211; and after the second sacrificial layer and the layers to-be-etched 211 are etched, removing the second patterned layer and the second sacrificial layer.

The size of the first opening 241 may determine the size of the second opening 212, and the size of the first opening 241 may be relatively small, which is beneficial for improving the uniformity of the sizes of the layers to-be-etched 211 formed.

Along the second direction X, the third opening 213 and the second opening 212 may be connected with each other.

Along the second direction X, the second opening 212 may have the first size; the third opening 213 may have the second size; and the first size may be less than the second size.

The first size may range from about 50 nanometers to about 110 nanometers.

Although the present disclosure has been disclosed above, the present disclosure may not be limited thereto. Any changes and modifications may be made by those skilled in the art without departing from the spirit and scope of the present disclosure, and the scope of the present disclosure should be determined by the scope defined by the appended claims.

What is claimed is:

1. A method for fabricating a semiconductor structure, comprising:
   providing a material layer over a substrate,
   forming a plurality of initial mask structures on the material layer, wherein the plurality of initial mask structures extends along a length direction and is arranged along a width direction, wherein the substrate includes:

a first region including a central region and edge regions sandwiching the central region, all extending along the width direction of the initial mask structures, and
   a second region extending along the length direction of the initial mask structures;
   removing portions of the plurality of initial mask structures at the edge regions of the first region and exposing edge-region-openings extending along the width direction of the initial mask structures over a surface of the material layer, thereby leaving a plurality of mask structures, wherein
      the plurality of initial mask structures are etched at the edge regions along an extending direction in the width direction, which is perpendicular to an extending direction of the plurality of initial mask structures along the length direction to keep distances between adjacent initial mask structures maintained along the width direction;
   using the plurality of mask structures as a mask, forming a plurality of material-layer structures over the substrate by:
      removing portions of the material layer from the edge-region-openings along the width direction of the mask structures, and
      simultaneously removing another portions of the material layer between adjacent mask structures along the length direction of the mask structures; and
   after forming the plurality of material-layer structures, further comprising:
      removing portions of the plurality of material-layer structures from the central region along the width direction, and
      simultaneously removing portions of the plurality of material-layer structures from the second region along the length direction.

2. The method according to claim 1, wherein:
   removing the portions of the plurality of material-layer structures from the central region provides a central region opening that extends along the width direction of the mask structures.

3. The method according to claim 2, wherein:
   along the length direction of the mask structures, the central region opening and the edge-region openings are connected with each other.

4. The method according to claim 2, wherein:
   along the length direction of the mask structures, the edge-region opening has a first size less than a second size of the central region opening.

5. The method according to claim 4, wherein:
   the first size of the edge region opening ranges from about 50 nanometers to about 110 nanometers.

6. The method according to claim 1, wherein:
   the plurality of initial mask structures is formed by forming a mask structure material film on the surface of the material layer, forming a plurality of mask layers on a surface of the mask structure material film, and using the plurality of mask layers as a mask, etching the mask structure material film till the material layer is exposed to form the plurality of initial mask structures.

7. The method according to claim 6, wherein:
   the mask structure material film includes a first mask material film on the surface of the material layer, a second mask material film on a surface of the first mask material film, and a third mask material film on a surface of the second mask material film.

8. The method according to claim 7, wherein:

one or more of the first mask material film, the second mask material film, and the third mask material film are made of a material including silicon oxide, silicon nitride, silicon carbon nitride, silicon boron nitride, silicon nitrogen carbon oxide, silicon nitrogen oxide, or a combination thereof.

9. The method according to claim 6, wherein:

the plurality of mask layers is formed by a self-aligned multiple patterning process.

10. The method according to claim 6, wherein:

a material of the plurality of mask layers is different from a material of the mask structure material film; and the plurality of mask layers is made of the material including silicon oxide, silicon nitride, silicon carbon nitride, silicon boron nitride, silicon nitrogen carbon oxide, silicon nitrogen oxide, or a combination thereof.

11. The method according to claim 1, wherein:

removing the portions of the plurality of material-layer structures from the second region provides a plurality of second-region openings that extends along the length direction of the mask structures;

removing the portions of the material layer from the edge regions provides an edge region opening that extends along the width direction of the mask structures; and the plurality of second-region openings intersect the edge region opening over the substrate.

12. The method according to claim 11, wherein:

removing the portions of the plurality of material-layer structures from the central region provides a central region opening that extends along the width direction of the mask structures; and the plurality of second-region openings further intersect the central region opening over the substrate.

13. The method according to claim 1, wherein:

the material layer is made of a material including silicon, germanium, silicon germanium, or any combination thereof.

14. The method according to claim 1, wherein:

a first portion of the plurality of mask structures at the central region has a length shorter than a second portion of the plurality of mask structures that is not at the central region along the second direction.

\* \* \* \* \*